(12) United States Patent
Sukekawa

(10) Patent No.: US 11,961,579 B2
(45) Date of Patent: Apr. 16, 2024

(54) BIT LINE NOISE SUPPRESSION AND RELATED APPARATUSES, METHODS, AND COMPUTING SYSTEMS

(71) Applicant: Micron Technology, Inc., Boise, ID (US)

(72) Inventor: Mitsunari Sukekawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 64 days.

(21) Appl. No.: 17/663,888

(22) Filed: May 18, 2022

(65) Prior Publication Data

US 2023/0377613 A1 Nov. 23, 2023

(51) Int. Cl.
*G11C 7/02* (2006.01)
*G11C 7/12* (2006.01)
*G11C 7/18* (2006.01)
*H03K 19/0185* (2006.01)

(52) U.S. Cl.
CPC .................. *G11C 7/02* (2013.01); *G11C 7/12* (2013.01); *G11C 7/18* (2013.01); *H03K 19/018521* (2013.01)

(58) Field of Classification Search
CPC .... G11C 7/02; G11C 7/12; G11C 7/18; H03K 19/018521
USPC ........................................................ 365/206
See application file for complete search history.

(56) References Cited

U.S. PATENT DOCUMENTS

| | | | | |
|---|---|---|---|---|
| 5,949,698 A * | 9/1999 | Shirley | .................... | G11C 8/12 365/69 |
| 6,043,562 A * | 3/2000 | Keeth | .................. | H10B 12/488 257/776 |
| 6,975,552 B2 * | 12/2005 | Kim | ......................... | G11C 7/18 365/205 |
| 10,607,923 B1 * | 3/2020 | Juengling | .............. | H10B 12/30 |
| 10,861,787 B1 * | 12/2020 | Sukekawa | ............... | H01L 25/18 |
| 11,043,500 B1 * | 6/2021 | Li | ......................... | H01L 23/528 |
| 2009/0225612 A1 * | 9/2009 | Juengling | ................ | G11C 7/12 365/202 |
| 2020/0286859 A1 * | 9/2020 | Sukekawa | ............... | H01L 25/50 |
| 2023/0209832 A1 * | 6/2023 | Takimoto | ................ | H01L 25/18 365/185.21 |
| 2023/0307395 A1 * | 9/2023 | Okada | ..................... | H01L 25/18 |

* cited by examiner

*Primary Examiner* — Ly D Pham
(74) *Attorney, Agent, or Firm* — TraskBritt

(57) ABSTRACT

Bit line noise suppression and related apparatuses, methods, and computing systems are disclosed. An apparatus includes a complementary metal-oxide-semiconductor (CMOS) wafer and a memory cell wafer. The CMOS wafer includes CMOS wafer contact pads and sense amplifier circuitry electrically connected to some of the CMOS wafer contact pads. The memory cell wafer includes memory cell wafer contact pads and bit lines electrically connected to some of the memory cell wafer contact pads. The bit lines include primary bit lines and secondary bit lines. Each of the secondary bit lines extends in parallel proximate to a corresponding one of the primary bit lines. A cross intersection of a first primary bit line with a first secondary bit line located proximate to a parity intersection of a second primary bit line with a second secondary bit line. The first primary bit line is adjacent to the second primary bit line.

20 Claims, 13 Drawing Sheets

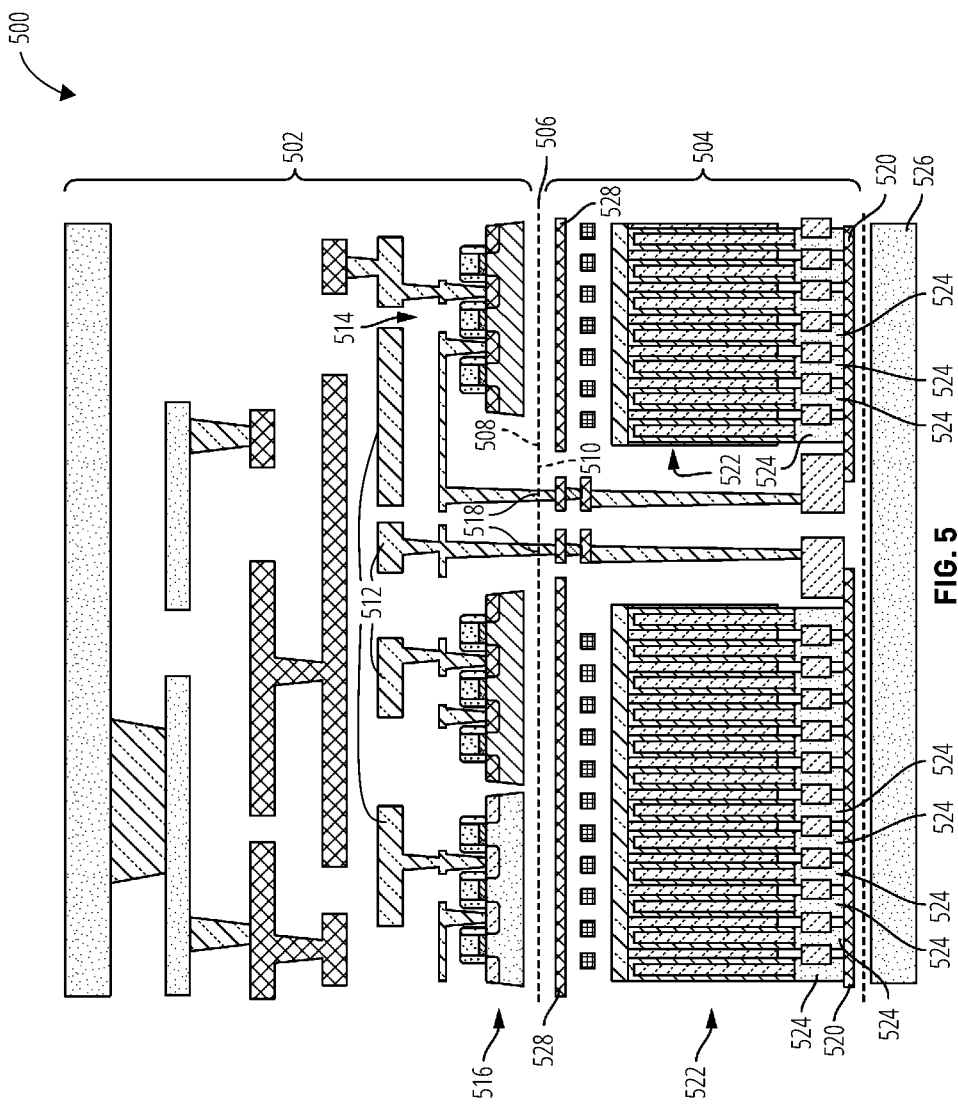

US 11,961,579 B2

BIT LINE NOISE SUPPRESSION AND RELATED APPARATUSES, METHODS, AND COMPUTING SYSTEMS

TECHNICAL FIELD

This disclosure relates generally to bit line noise suppression, and more specifically to bit line noise suppression for memory devices including a complementary metal-oxide-semiconductor (CMOS) wafer and a memory cell wafer bonded to the CMOS wafer.

BACKGROUND

The demand for ever smaller devices and ever denser memory has led to the size of memory cells becoming smaller and smaller. For example, 4F2 memory devices include memory cells wherein each memory cell has a cell area that is at most four times a square of a minimum feature size (f) (e.g., half a word line pitch) ($4f^2$, or 2f×2f).

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 5 is a cross-sectional view of a memory device having a CMOS over array configuration, according to some embodiments;

DETAILED DESCRIPTION

Figure 1A:
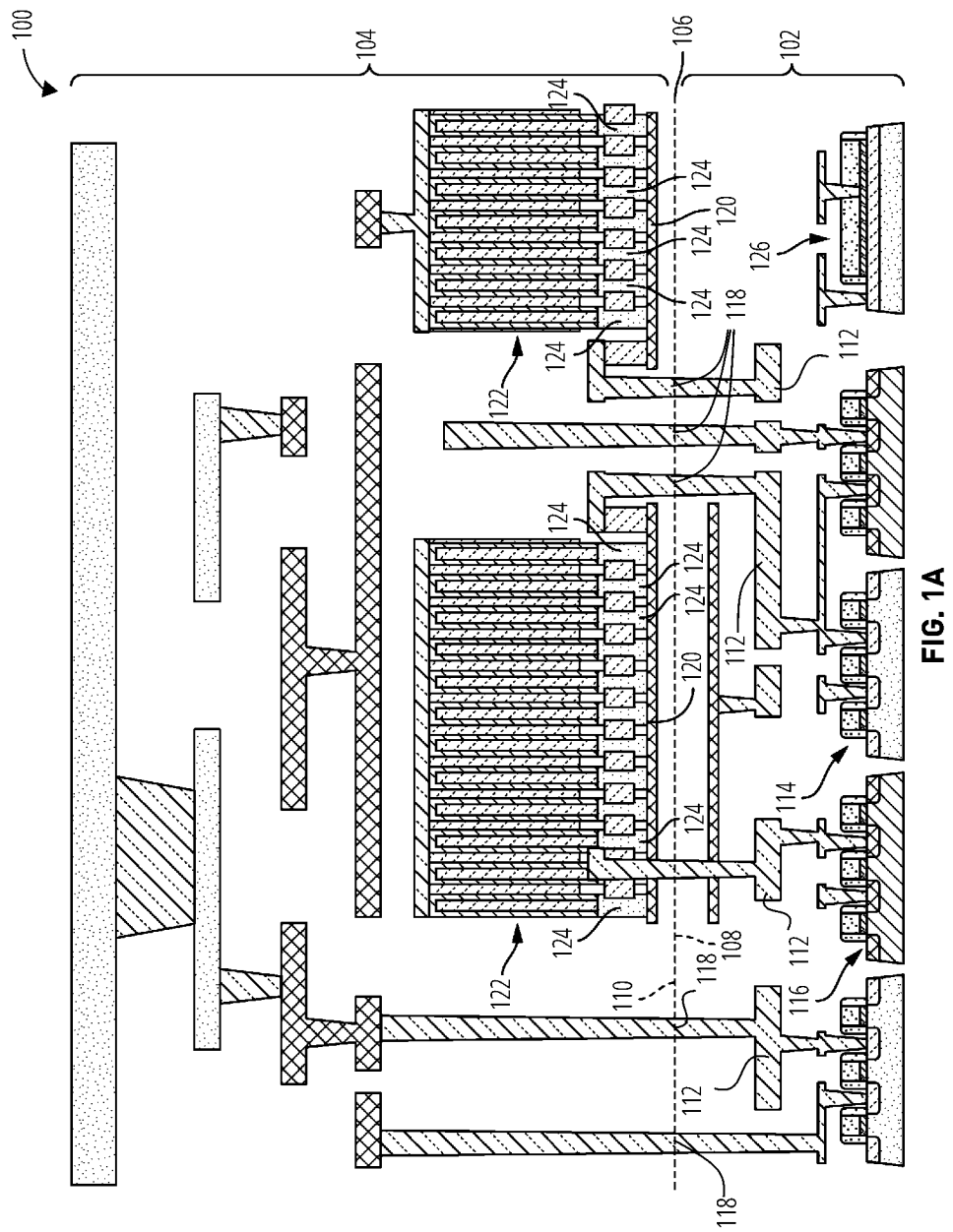
FIG. 1A is a cross-sectional view of a memory device having a CMOS under array configuration, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

One way to manufacture memory devices including relatively small memory cells such as 4F2 dynamic random access memory (DRAM) cells is to stack a memory cell wafer and a CMOS wafer (e.g., with the memory cell wafer over the CMOS wafer or with the CMOS wafer over the memory cell wafer), and bond the memory cell wafer and the CMOS wafer together. Array signal noise for such memory devices, however, may be relatively large at the time of data reading because capacitances between bit lines may be relatively large. One way to suppress this array signal noise may be to use twisted bit lines that are alternately intersected with secondary bit lines of the memory cell. An alignment resolution for aligning memory wafer contact pads with CMOS wafer contact pads, however, may be less accurate than contact pad manufacturing resolution. As a result, the memory wafer contact pads and the CMOS wafer contact pads may sometimes be misaligned during bonding of the wafers. Misalignment of the contact pads may lead to short circuits and/or open circuits in the circuitry of the memory device. Accordingly, it may be difficult to manufacture twisted bit lines. Various embodiments disclosed herein may relate to correcting misalignment between contacts of the memory cell wafer and the CMOS wafer by forming a landing pad to correct contact position, and by using one of the four-bit wires as the twisted bit lines to be drawn out to the sense amplifier. As a result, it may be possible to connect bit lines of a memory cell wafer to sense amplifiers of the CMOS wafer.

In some embodiments an apparatus includes a CMOS wafer and a memory cell wafer attached to the CMOS wafer. The CMOS wafer includes CMOS wafer contact pads and sense amplifier circuitry electrically connected to some of the CMOS wafer contact pads. The memory cell wafer includes memory cell wafer contact pads and bit lines electrically connected to some of the memory cell wafer contact pads. The bit lines include primary bit lines and secondary bit lines. Each of the secondary bit lines extends in parallel proximate to a corresponding one of the primary bit lines. A cross intersection of a first primary bit line of the primary bit lines with a first secondary bit line of the secondary bit lines is located proximate to a parity intersection of a second primary bit line of the bit lines with a second secondary bit line of the secondary bit lines. The first primary bit line is adjacent to the second primary bit line.

In some embodiments a method of manufacturing a memory device includes aligning memory cell wafer contact pads of a memory cell wafer including bit lines with complementary metal-oxide-semiconductor (CMOS) wafer contact pads of a CMOS wafer including sense amplifier circuitry. The bit lines include primary bit lines and secondary bit lines. Each of the secondary bit lines extends in parallel proximate to a corresponding one of the primary bit lines. A cross intersection of a first primary bit line of the primary bit lines with a first secondary bit line of the secondary bit lines is located proximate to a parity intersection of a second primary bit line of the bit lines with a second secondary bit line of the secondary bit lines. The first primary bit line is adjacent to the second primary bit line. The method also includes testing electrical conductivity of the memory device to determine whether the memory cell wafer contact pads are properly aligned with the CMOS wafer contact pads. The method further includes adjusting alignment of the memory cell wafer contact pads relative to the CMOS wafer contact pads responsive to a determination that the memory cell wafer contact pads are not properly aligned with the CMOS wafer contact pads, and bonding the memory cell wafer contact pads to the CMOS wafer contact pads responsive to a determination that the memory cell wafer contact pads are properly aligned with the CMOS wafer contact pads.

In some embodiments a computing system includes a CMOS wafer and a memory cell wafer bonded to the CMOS wafer. The CMOS wafer includes sense amplifier circuitry and sub word driver circuitry. The memory cell wafer includes primary bit lines and secondary bit lines, each of the secondary bit lines extends in parallel proximate to a corresponding one of the primary bit lines, a cross intersection of a first primary bit line of the primary bit lines with a first secondary bit line of the secondary bit lines is located proximate to a parity intersection of a second primary bit line of the bit lines with a second secondary bit line of the secondary bit lines. The first primary bit line is adjacent to the second primary bit line.

FIG. 1A is a cross-sectional view of a memory device 100 (e.g., a 4F2 DRAM device, without limitation) in a CMOS under array configuration, according to some embodiments. By way of non-limiting example, the memory device 100 may be a single deck 4F2 DRAM device. The memory device 100 includes a CMOS wafer 102 and a memory cell wafer 104 that is attached to (e.g., bonded to) the CMOS wafer 102 along an interface 106. The interface 106 between the CMOS wafer 102 and the memory cell wafer 104 includes a CMOS wafer bonding surface 110 of the CMOS wafer 102 bonded to (e.g., by way of a combination of oxide-oxide bonding and metal-metal bonding) a memory cell wafer bonding surface 108 of the memory cell wafer 104. The CMOS wafer bonding surface 110 faces the memory cell wafer bonding surface 108 at the interface 106. While the interface 106 is depicted by way of a dashed line in FIG. 1A, the interface 106 is not necessarily a bond line that is readily apparent upon visual inspection. Put another way, the CMOS wafer 102 and the memory cell wafer 104 may be bonded to one another without a bond line. Interconnects are also illustrated in FIG. 1A. The interconnects may include conductive material (e.g., copper).

The CMOS wafer 102 includes CMOS wafer contact pads 112 at the memory cell wafer bonding surface 108. The CMOS wafer 102 also includes sense amplifier circuitry 114 electrically connected to some of the CMOS wafer contact pads 112. The CMOS wafer 102 also includes sub word driver (SWD) circuitry 116 electrically connected to others of the CMOS wafer contact pads 112. The CMOS wafer 102 further includes a compensation capacitor 126 (e.g., a metal-oxide-semiconductor (MOS) capacitor) in an otherwise vacant area of the CMOS wafer 102.

The memory cell wafer 104 includes memory cell wafer contact pads 118 at the memory cell wafer bonding surface 108. The memory cell wafer 104 also includes bit lines and word lines 124. The bit lines include primary bit lines 120 and secondary bit lines (secondary bit lines not shown in FIG. 1A). The bit lines are electrically connected to some of the memory cell wafer contact pads 118. For example, FIG. 1A illustrates that the primary bit lines 120 are electrically connected to some of the memory cell wafer contact pads 118. The memory cell wafer 104 further includes memory cells 122 electrically connected to the bit lines (i.e., to the primary bit lines 120). By way of non-limiting example, the memory cells 122 may be 4F2 memory cells. The memory cell wafer 104 also includes word lines 124 electrically connected to others of the memory cell wafer contact pads 118.

The memory cell wafer contact pads 118 are bonded to the CMOS wafer contact pads 112 with the memory cell wafer 104 over the CMOS wafer 102. With the memory cell wafer contact pads 118 bonded to the CMOS wafer contact pads 112, the primary bit lines 120 of the memory cell wafer 104 are electrically connected to the sense amplifier circuitry 114 through the memory cell wafer contact pads 118 and the CMOS wafer contact pads 112. Also, the word lines 124 are electrically connected to the SWD circuitry 116 through the memory cell wafer contact pads 118 and the CMOS wafer contact pads 112. A memory cell transistor may be joined to the CMOS wafer 102 by wafer bonding, and contacts and wiring may be connected to compensate for alignment deviation due to wafer bonding.

Figure 1B:
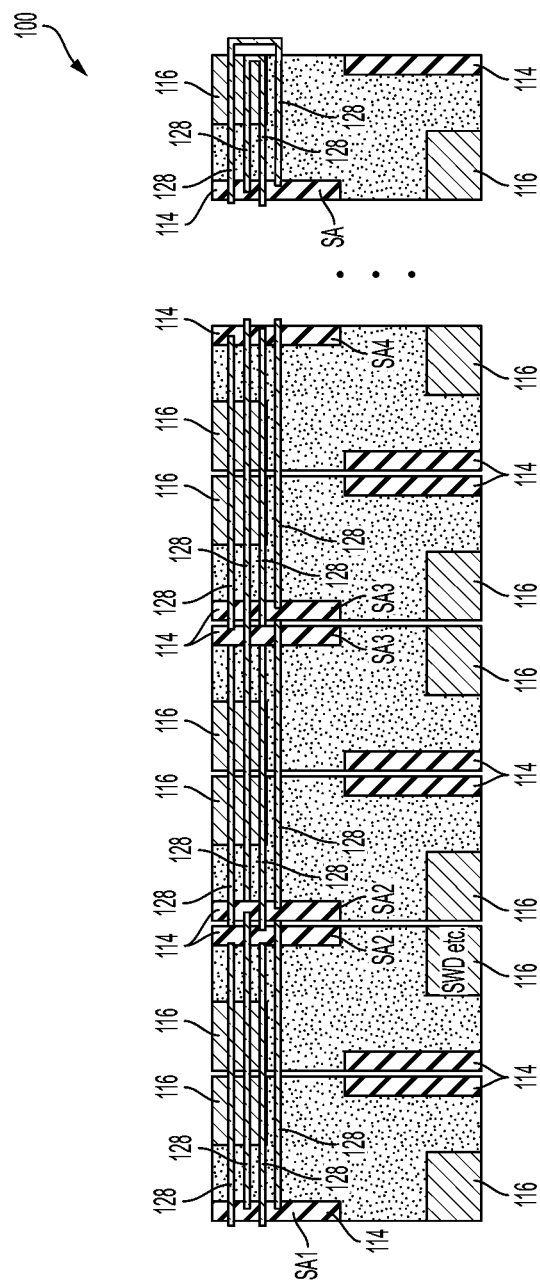
FIG. 1B is an example layout design of a portion of the memory device of FIG. 1A.

FIG. 1B is an example layout design of a portion of the memory device 100 of FIG. 1A. FIG. 1B illustrates the secondary bit lines 128 (not shown in FIG. 1A), the sense amplifier circuitry 114, and the SWD circuitry 116. The sense amplifier circuitry 114 includes sense amplifiers SA1, SA2, SA2', SA3, SA3', SA4, and SA. Sense amplifiers SA1 and SA3 have crossed bit line structures, which takes up a relatively large amount of chip area to implement. SA2 has a parity bit line structure, which takes up less chip area to implement. Each of the secondary bit lines 128 extends in parallel proximate to a corresponding one of the primary bit lines 120 (FIG. 1A, not shown in FIG. 1B).

Since portions of the CMOS wafer 102 (FIG. 1A) other than the sense amplifier circuitry 114 and the SWD circuitry 116 may be used for compensation capacitors 126 (FIG. 1A) (e.g., MOS capacitors) and peripheral circuits (not shown), chip area used to implement the memory device 100 may be reduced.

Figure 1C:
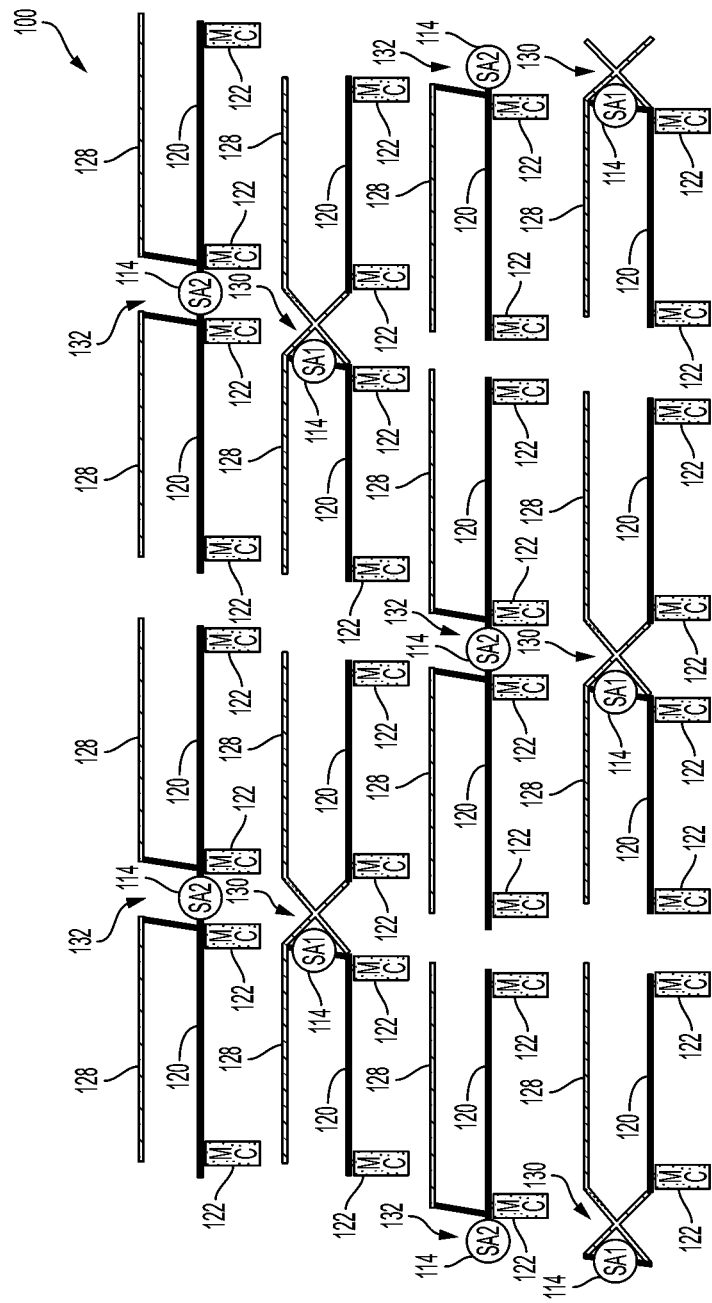
FIG. 1C is a schematic diagram illustrating a twisted architecture of bit lines of the memory device of FIG. 1A and FIG. 1B.

FIG. 1C is a schematic diagram illustrating a twisted architecture of the bit lines of the memory device 100 of FIG. 1A and FIG. 1B. FIG. 1C illustrates the primary bit lines 120, their corresponding secondary bit lines 128, memory cells 122 electrically connected to the primary bit lines 120, and sense amplifier circuitry 114 electrically connected to the primary bit lines 120. Each of the primary bit lines 120 has a corresponding one of the secondary bit lines 128 that extends at least substantially in parallel thereto.

For 4F2 DRAM devices, twisted bit lines may be used to suppress (e.g., cancel) a decrease in signal levels due to interference between the bit lines. As used herein, the term "twisted," when used with reference to electrical lines such as bit lines, refers to alternating intersections of substantially parallel running electrical lines such as of primary bit lines (e.g., the primary bit lines 120) with secondary bit lines (e.g., the secondary bit lines 128). As used herein, the term "intersection" indicates that electrical lines cross but do not electrically connect with each other. The layout of the secondary bit lines 128 may be similar to that of the primary bit lines 120. By way of non-limiting example, the primary bit lines 120 may be formed in a first electrically conductive layer and the secondary bit lines 128 may be formed in a second electrically conductive layer (e.g., below the first electrically conductive layer). Also by way of non-limiting example, the secondary bit lines 128 may share a common electrically conductive layer with the memory cell wafer contact pads 118 (e.g., the secondary bit lines 128 may be in the same conductive layer as the memory cell wafer contact pads 118).

Various different configurations may be used to implement a twisted bit line architecture. The configuration illustrated in FIG. 1C is an example of a quilt layout for a twisted bit line architecture. The memory device 100 includes cross intersections 130 and parity intersections 132 of the primary bit lines 120 with the secondary bit lines 128. The cross intersections 130 may include a line shaped pair of bit lines and the lines may be twisted at a center region. The parity intersections 132 may include a u-shaped pair of bit lines. The cross intersections 130 may occupy a larger area of the memory cell wafer 104 (FIG. 1A) to implement than an area taken to implement the parity intersections 132. Accordingly, each one of the cross intersections 130 of the primary bit lines 120 with the secondary bit lines 128 may be located proximate to one of the parity intersections 132 of the primary bit lines 120 with secondary bit lines 128. For example, a cross intersection of a first primary bit line of the primary bit lines 120 with a first secondary bit line of the secondary bit lines 128 may be located proximate to a parity intersection of a second primary bit line of the primary bit lines 120 with a second secondary bit line of the secondary bit lines 128. The first primary bit line is adjacent to the second primary bit line.

Figure 1D:
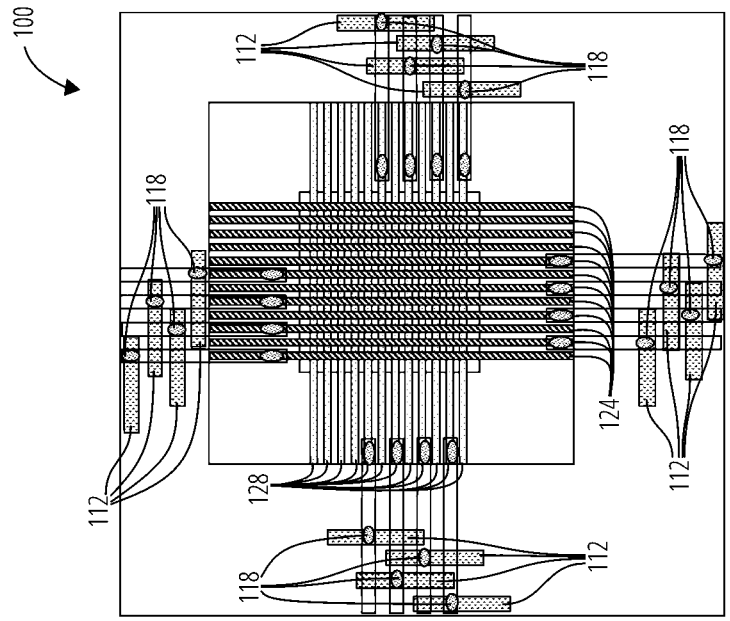
FIG. 1D is a plan view of a layout design for the memory device of FIG. 1A, FIG. 1B, and FIG. 1C, according to some embodiments.
Figure 2:
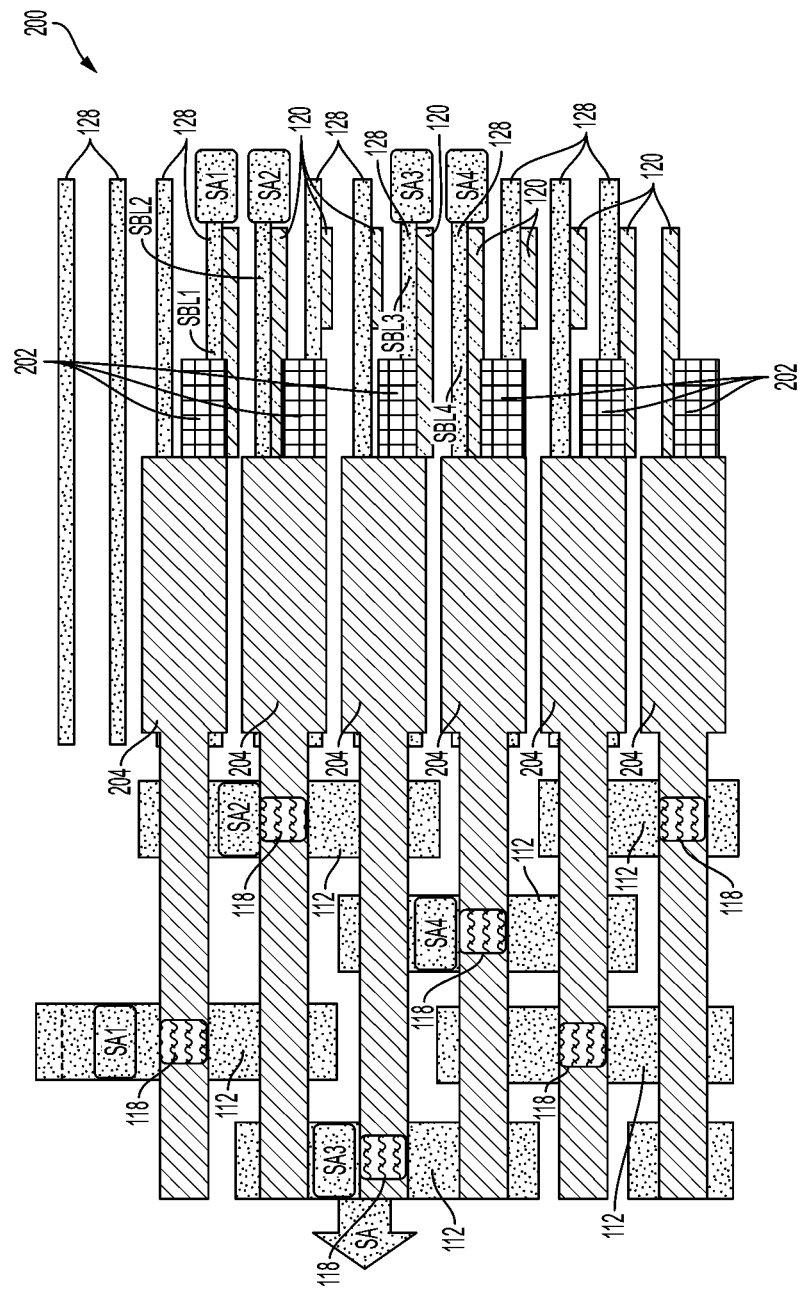
FIG. 2 is a plan view of a first portion of the layout design of FIG. 1D.
Figure 3:
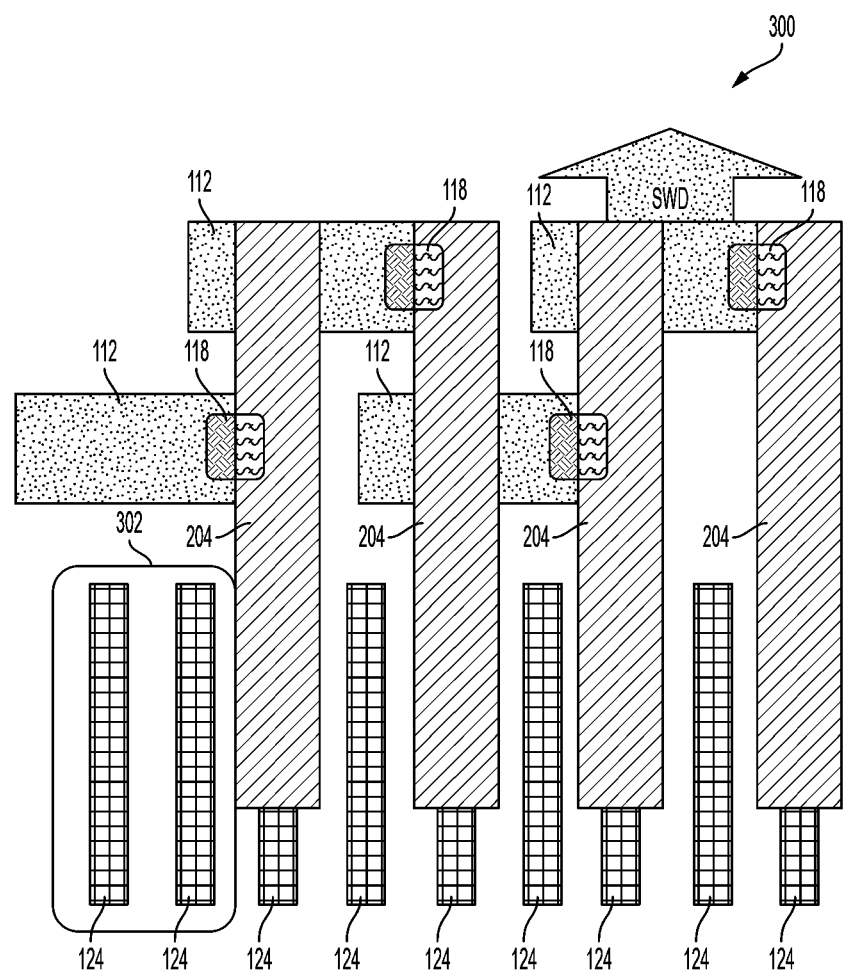
FIG. 3 is a plan view of a second portion of the layout design of FIG. 1D.

FIG. 1D is a plan view of a layout design for the memory device 100 of FIG. 1A, FIG. 1B, and FIG. 1C, according to some embodiments. FIG. 1D illustrates the memory cell wafer 104 over the CMOS wafer 102. FIG. 1D also illustrates the secondary bit lines 128, the word lines 124, the CMOS wafer contact pads 112, and the memory cell wafer contact pads 118. The CMOS wafer contact pads 112 are electrically connected to the memory cell wafer contact pads 118 to electrically connect the sense amplifier circuitry 114 (FIG. 1A, FIG. 1B, and FIG. 1C, not shown in FIG. 1D) and the SWD circuitry 116 (FIG. 1A and FIG. 1B, not shown in FIG. 1D) to the secondary bit lines 128 and the word lines 124, respectively. Enlarged versions of a first portion 200 and a second portion 300 of the layout design illustrated in FIG. 1D are illustrated in FIG. 2 and FIG. 3, respectively.

Since the alignment accuracy of bonding is less precise than the alignment accuracy of device feature formation, it may be relatively difficult to properly align and electrically connect the memory cell wafer 104 to the CMOS wafer 102. Proper electrical connection may be made by measuring a deviation after bonding and adjusting the contact position. Extra memory cells and word lines along with long CMOS wafer contact pads 112 may be used for correcting the bonding alignment error by the amount of bonding alignment deviation. In the example illustrated in FIG. 1D, four extra secondary bit lines 128 and four extra word lines 124 are used. As a result, proper alignment between the CMOS wafer 102 and the memory cell wafer 104 may be achieved without a high degree of precision (e.g., not as precise as feature manufacturing of the CMOS wafer 102 and the memory cell wafer 104).

Figure 1E:
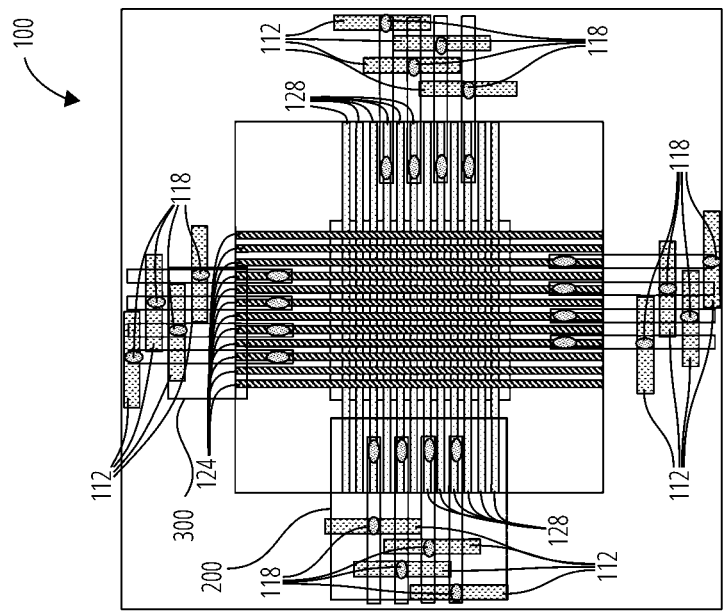
FIG. 1E is a plan view of the layout design for the memory device illustrated in FIG. 1D with a memory cell wafer shifted relative to a CMOS wafer as compared to their positions in FIG. 1D.

FIG. 1E is a plan view of the layout design for the memory device 100 illustrated in FIG. 1D. With the memory cell wafer 104 shifted relative to the CMOS wafer 102 as compared to their positions in FIG. 1D. Specifically, the memory cell wafer 104 is moved upward and to the right, from the plan view perspective as compared to that of FIG. 1D. Since extra word lines 124 and primary bit lines 120 are included, however, the CMOS wafer 102 and the memory cell wafer 104 may still be properly aligned. Specifically, some of the secondary bit lines 128 and word lines 124 that were not electrically connected to the CMOS wafer contact pads 112 in FIG. 1D are electrically connected to the CMOS wafer contact pads 112 in FIG. 1E.

As a specific, non-limiting example, the bottom two primary bit lines 120 and the furthest to the left word lines 124 in FIG. 1D are not electrically connected to the CMOS wafer contact pads 112, but are electrically connected to the CMOS wafer contact pads 112 in FIG. 1E. Accordingly, the inclusion of extra word lines and extra bit lines enables multiple proper alignments between the CMOS wafer 102 and the memory cell wafer 104. As a result, any of various proper alignments between the CMOS wafer 102 and the memory cell wafer 104 may result from an alignment process that is less precise than feature manufacturing, and misalignment errors may be prevented.

FIG. 2 is a plan view of the first portion 200 of the layout design of FIG. 1D. FIG. 2 illustrates a layout design of the memory cell wafer 104 within the first portion 200. The first portion 200 includes the primary bit lines 120, the secondary bit lines 128, the memory cell wafer contact pads 118, and the CMOS wafer contact pads 112 (e.g., electrically connected to first sense amplifier SA1, second sense amplifier SA2, third sense amplifier SA3, and fourth sense amplifier SA4). The first portion 200 also includes memory cell wafer conductive material 202, 204 electrically connecting the secondary bit lines 128 and the primary bit lines 120 to the memory cell wafer contact pads 118. The CMOS wafer 102 (FIG. 1A, FIG. 1D, and FIG. 1E, not shown in FIG. 2) includes the CMOS wafer contact pads 112. The memory cell wafer 104 (FIG. 1A, FIG. 1D, and FIG. 1E, not shown in FIG. 2) includes the primary bit lines 120, the secondary bit lines 128, the memory cell wafer contact pads 118, and the memory cell wafer conductive materials 202, 204. In some examples the secondary bit lines 128 may be implemented using a same conductive material layer as the memory cell wafer contact pads 118.

With the CMOS wafer 102 bonded to the memory cell wafer 104, the first sense amplifier SA1 is electrically connected to a first secondary bit line SBL1 of the secondary bit lines 128 through one of the memory cell wafer contact pad 118, one of the memory cell wafer conductive material 204, and one of the memory cell wafer conductive material 202. Similarly, the second sense amplifier is electrically connected to a second secondary bit line SBL2, the third sense amplifier is electrically connected to a third secondary bit line SBL3, and the fourth sense amplifier SA4 is electrically connected to a fourth secondary bit line SBL4.

The CMOS wafer contact pads 112 are elongated vertically from the perspective of the plan view of FIG. 2 to accommodate shifting up or down of the memory cell wafer 104 with respect to the CMOS wafer 102. In the example illustrated in FIG. 2, the CMOS wafer contact pads 112 are long enough to accommodate 6.5 bit line pitches of total vertical motion (from the perspective of the plan view of FIG. 2) of the memory cell wafer 104 relative to the CMOS wafer 102.

In the first portion 200, four of the secondary bit lines 128 and four of the memory cell wafer contact pads 118 are indicated as being electrically connected to specific sense amplifiers (a first sense amplifier SA1, a second sense amplifier SA2, a third sense amplifier SA3, and a fourth sense amplifier SA4). Two of these four secondary bit lines are electrically connected to a one-sided sense amplifier. One of these four secondary bit lines is a twisted bit line.

FIG. 3 is a plan view of the second portion 300 of the layout design of FIG. 1D. FIG. 3 indicates the wiring layout of ends of the word lines 124. The second portion 300 includes the word lines 124, the CMOS wafer contact pads 112, the memory cell wafer contact pads 118, and memory cell wafer conductive material 204. The memory cell wafer 104 (FIG. 1A, FIG. 1D, and FIG. 1E, not shown in FIG. 3) includes the word lines 124, the memory cell wafer conductive material 204, and the memory cell wafer contact pads 118. In some embodiments the memory cell wafer conductive material 202 of FIG. 2 is implemented using the same conductive material layer as the word lines 124. The memory cell wafer conductive material 204 electrically connects the memory cell wafer contact pads 118 to the word lines 124. The CMOS wafer 102 includes the memory cell wafer contact pads 118. The memory cell wafer contact pads 118 are electrically connected to the word lines 124 through the memory cell wafer conductive material 204 and the memory cell wafer contact pads 118.

A length of the CMOS wafer contact pads 112 from side to side (from the perspective of the plan view of FIG. 3) enables proper alignment between the CMOS wafer 102 and the memory cell wafer 104 despite left to right motion of the memory cell wafer 104 with respect to the CMOS wafer 102. Also, the word lines 124 may be connected to any every other one of the CMOS wafer contact pads 112. Since word lines 124 may be connected to any CMOS wafer contact pad 112, the size (left to right length in FIG. 3) of the CMOS wafer contact pads 112 that electrically connect to the word lines 124 may be smaller than the size (the up to down length in FIG. 2) of the CMOS wafer contact pads 112 that electrically connect to the secondary bit lines 128.

The second portion 300 includes two extra word lines 302 in contrast to the first portion 200, which does not include extra primary or secondary bit lines (but does include an extra line of the memory cell wafer conductive material 204). A position of the memory cell wafer contact pads 118 and the memory cell wafer conductive material 204 may be adjusted according to bonding alignment error. In the PHOTO Field area, centers of the word lines 124 must be within the range of the red arrow. Within shot distortion of bonding alignment error may be tolerated up to twice a pitch of the word lines 124.

Figure 4A:
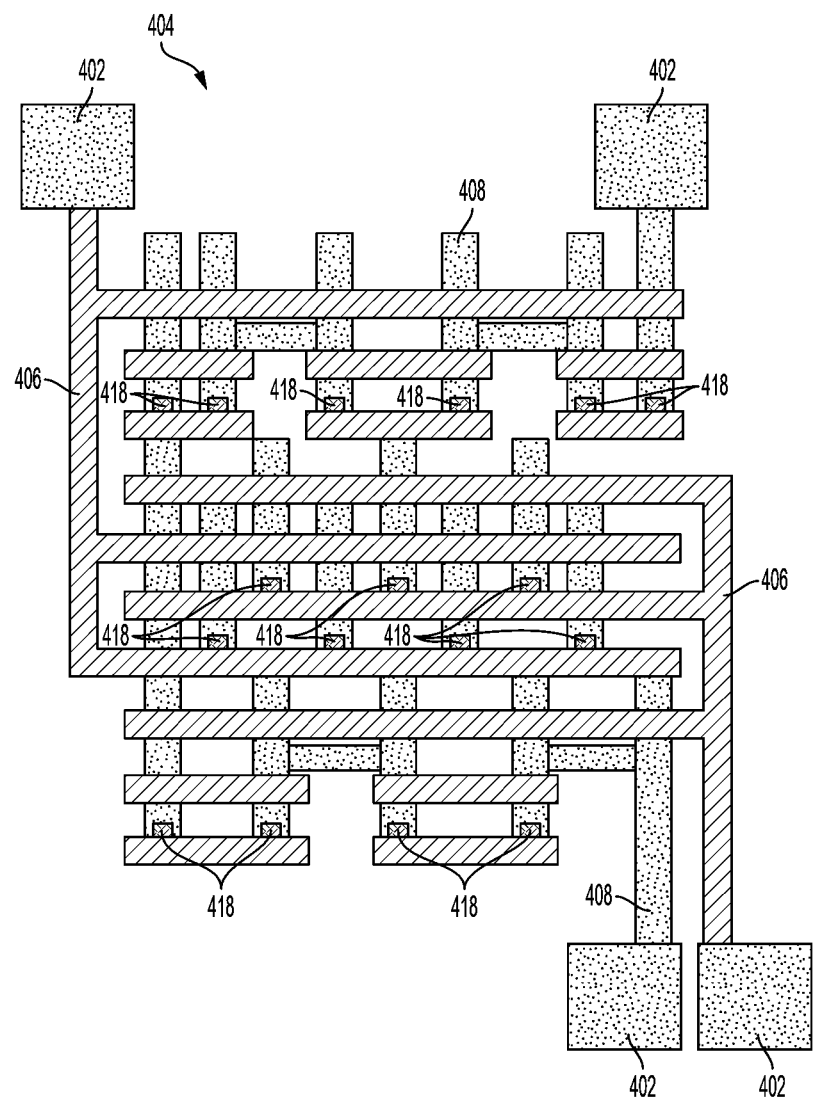
FIG. 4A is a plan view of a layout design of a sense amplifier test element group (TEG) structure for testing electrical connections between secondary bit lines and CMOS wafer contact pads of FIG. 2, according to some embodiments.

FIG. 4A is a plan view of a layout design of a sense amplifier test element group (TEG) structure 404 for testing electrical connections between the secondary bit lines 128 and the CMOS wafer contact pads 112 of FIG. 2, according to some embodiments. It should be noted that the sense amplifier TEG structure 404 may also be used for testing electrical connections between secondary bit lines 528 and CMOS wafer contact pads 512 of a memory device 500 of FIG. 5. By way of non-limiting example, the sense amplifier TEG structure 404 may be implemented in a scribe portion of the memory cell wafer 104 (FIG. 1A, FIG. 1D, FIG. 1E, not shown in FIG. 4A) and the CMOS wafer 102 (FIG. 1A, FIG. 1D, FIG. 1E, not shown in FIG. 4A).

The sense amplifier TEG structure 404 incudes memory cell wafer TEG traces 406 (e.g., implemented in the memory cell wafer conductive material 204 of FIG. 2 and FIG. 3), CMOS wafer TEG traces 408 (e.g., implemented using a same conductive material layer as the CMOS wafer contact pads 112 of FIG. 2), and TEG contact pads 418 (e.g., implemented in a same conductive material layer as the memory cell wafer contact pads 118 of FIG. 2). Probe pads 402 are electrically connected to the sense amplifier TEG structure 404. The probe pads 402 are configured to enable testing to determine whether the CMOS wafer contact pads 112 are properly aligned with the memory cell wafer contact pads 118.

Features of the sense amplifier TEG structure 404 may be configured to be in proper alignment only when the CMOS wafer contact pads 112 are in proper alignment with the memory cell wafer contact pads 118. As a result, testing electrical connection between the probe pads 402 may enable detection of whether or not the CMOS wafer contact pads 112 are electrically connected to the memory cell wafer contact pads 118.

Figure 4B:
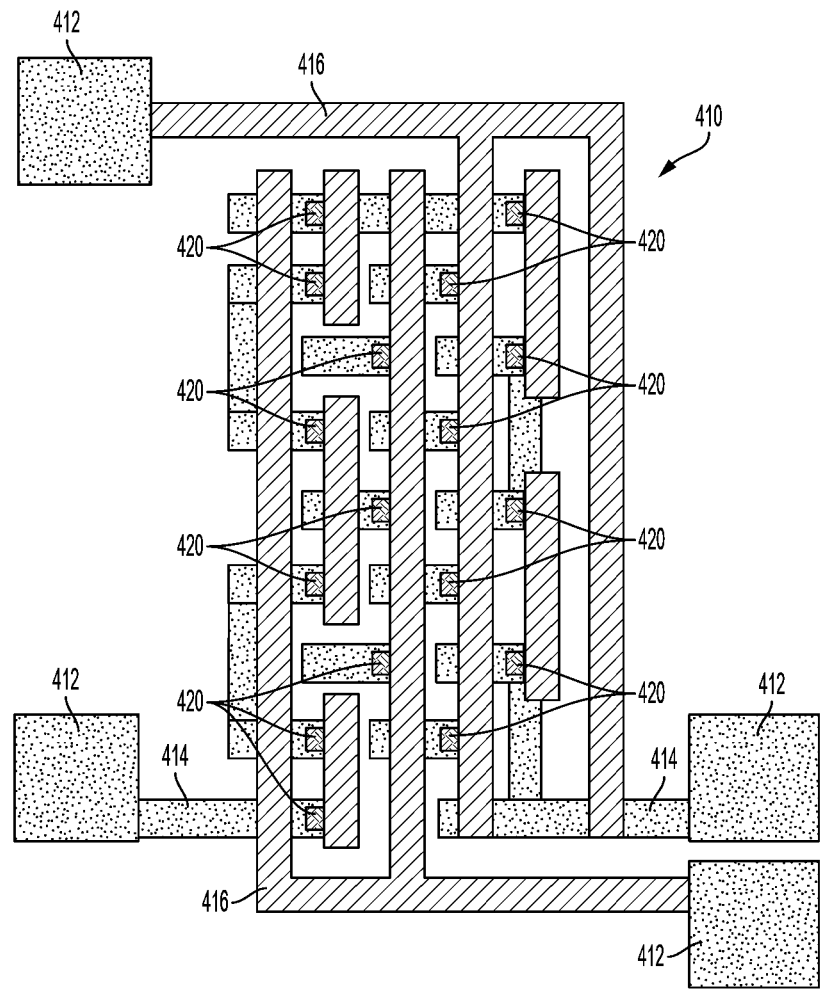
FIG. 4B is a plan view of a layout design of a sub word driver (SWD) TEG structure for testing electrical connections between word lines and CMOS wafer contact pads of FIG. 3, according to some embodiments.

FIG. 4B is a plan view of a layout design of a SWD TEG structure 410 for testing electrical connections between the word lines 124 and the CMOS wafer contact pads 112 of FIG. 3, according to some embodiments. Similar to the sense amplifier TEG structure 404, the SWD TEG structure 410 may be implemented in a scribe portion of the memory cell wafer 104 and the CMOS wafer 102. It should be noted that the SWD TEG structure 410 may also be used for testing electrical connections between word lines 524 and CMOS wafer contact pads 512 of the memory device 500 of FIG. 5.

The SWD TEG structure 410 incudes memory cell wafer TEG traces 416 (e.g., implemented in the memory cell wafer conductive material 204 of FIG. 2 and FIG. 3), CMOS wafer TEG traces 414 (e.g., implemented using a same conductive material layer as the CMOS wafer contact pads 112 of FIG. 3), and TEG contact pads 420 (e.g., implemented in a same conductive material layer as the memory cell wafer contact pads 118 of FIG. 3). Probe pads 412 are electrically connected to the SWD TEG structure 410. The probe pads 412 are configured to enable testing to determine whether the CMOS wafer contact pads 112 are properly aligned with the memory cell wafer contact pads 118.

Features of the sense amplifier SWD TEG structure 410 may be configured to be in proper alignment only when the CMOS wafer contact pads 112 are in proper alignment with the memory cell wafer contact pads 118. As a result, testing electrical connection between the probe pads 412 may enable detection of whether or not the CMOS wafer contact pads 112 are electrically connected to the memory cell wafer contact pads 118.

FIG. 5 is a cross-sectional view of a memory device 500 (e.g., a single deck 4F2 DRAM device, without limitation) having a CMOS over array ("CoA") configuration, according to some embodiments. By way of non-limiting example, the memory device 500 may be a single deck 4F2 DRAM device. The memory device 500 is similar to the memory device 100 of FIG. 1A. For example, the memory device 500 includes a CMOS wafer 502, a memory cell wafer 504, and an interface 506 between the CMOS wafer 502 and the memory cell wafer 504, which are similar to the CMOS wafer 102, the memory cell wafer 104, and the interface 106 of the memory device 100 of FIG. 1A except that the CMOS wafer 502 is over the memory cell wafer 504 (in contrast to the memory cell wafer 104 of FIG. 1A, which is over the CMOS wafer 102). FIG. 5 also illustrates a carrier wafer 526 with the memory cell wafer 504 and the CMOS wafer 502 over the carrier wafer 526.

The CMOS wafer 502 includes a CMOS wafer bonding surface 510, CMOS wafer contact pads 512, sense amplifier circuitry 514, and SWD circuitry 516 similar to the CMOS wafer bonding surface 110, CMOS wafer contact pads 112, sense amplifier circuitry 114, and SWD circuitry 116 discussed with reference to FIG. 1A. The memory cell wafer 504 includes a memory cell wafer bonding surface 508, memory cell wafer contact pads 518, primary bit lines 520, memory cells 522, and word lines 524 similar to the memory cell wafer bonding surface 108, memory cell wafer contact pads 118, primary bit lines 120, and word line 124 discussed with reference to FIG. 1A. The memory cell wafer 504 also includes secondary bit lines 528 similar to the secondary bit lines 128 discussed with reference to FIG. 1B, FIG. 1C, and FIG. 1D. The memory cell wafer contact pads 518 are bonded to the CMOS wafer contact pads 512 with the CMOS wafer 502 over the memory cell wafer 504.

The primary bit lines 520 and the secondary bit lines 528 may be implemented using the twisted bit line architecture illustrated in FIG. 1C. For example, each of the secondary bit lines 528 may extend in parallel proximate to a corresponding one of the primary bit lines 520 with a cross intersection of a first primary bit line of the primary bit lines 520 with a first secondary bit line of the secondary bit lines 528 located proximate to a parity intersection of a second primary bit line of the primary bit lines 520 with a second secondary bit line of the secondary bit lines 528, and with the first primary bit line adjacent to the second primary bit line.

Figure 6:
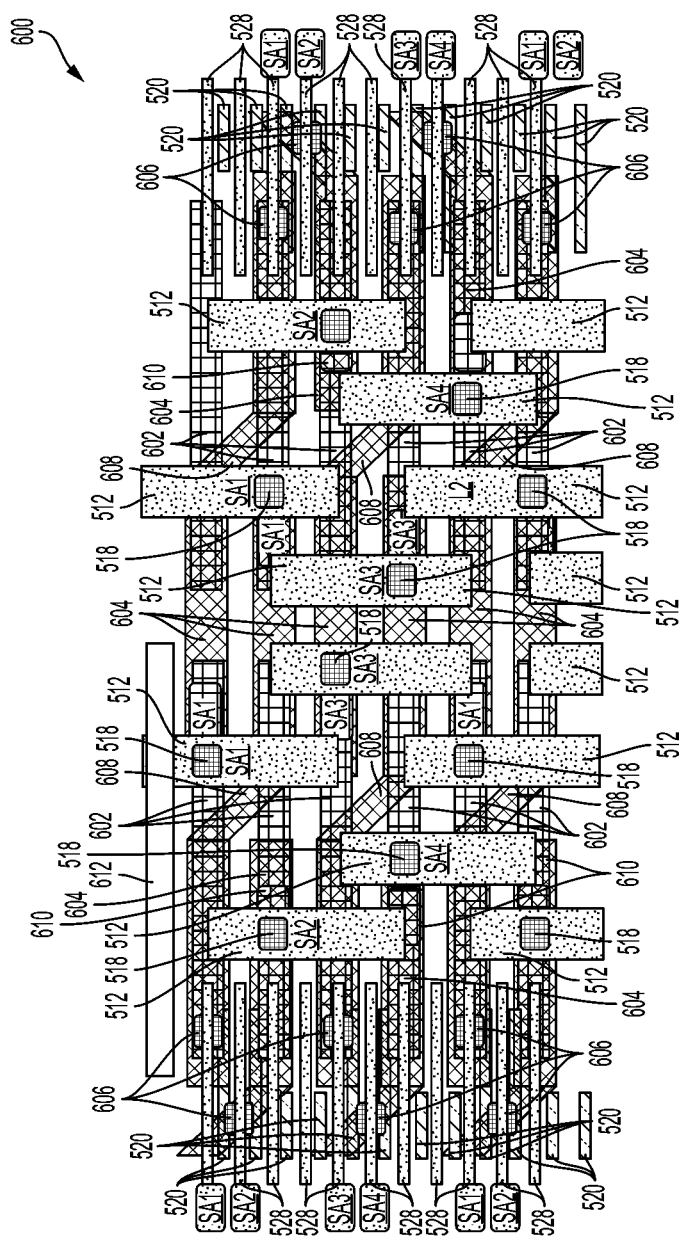
FIG. 6 is a plan view of a first portion of the memory device of FIG. 5, according to some embodiments.

FIG. 6 is a plan view of a first portion 600 of the memory device 500 of FIG. 5, according to some embodiments. The first portion 600 includes the primary bit lines 520, the secondary bit lines 528, and the memory cell wafer contact pads 518 of the memory cell wafer 504 (FIG. 5, not shown in FIG. 6) and the CMOS wafer contact pads 512 of the CMOS wafer 502 (FIG. 5, not shown in FIG. 6).

FIG. 6 illustrates electrical connection between the secondary bit lines 528 and the CMOS wafer contact pads 512. The first portion 600 includes memory cell wafer interconnects 606, word line layer conductive material 602, and memory cell wafer conductive material 604 of the memory cell wafer 504 electrically connecting the secondary bit lines 528 to the memory cell wafer contact pads 518. The secondary bit lines 528 are electrically connected to the CMOS wafer contact pads 512 through the memory cell wafer interconnects 606, the word line layer conductive material 602, the memory cell wafer conductive material 604, and the memory cell wafer contact pads 518. FIG. 6 illustrates the twisted bit line architecture of FIG. 1C. For example, the first portion 600 includes cross intersections 608 and parity intersections 610 of the bit lines 520 with the secondary bit lines 128. As illustrated in FIG. 6, the cross intersections 608 are each located in proximity to one of the parity intersections 610. A relatively sparse layout design corresponding to the parity intersections 610 results in a little extra chip area to accommodate occupation of a little extra chip area by the cross intersection 608 due to a relatively busy layout design corresponding to the cross intersections 608.

The first portion 600 also includes CMOS wafer electrically conductive material 612 that electrically connects one of the CMOS wafer contact pads 512 to a sense amplifier of the sense amplifier circuitry 514 (FIG. 5). Although not shown, each of the CMOS wafer contact pads 112 is electrically connected to the sense amplifier circuitry 514 using CMOS wafer electrically conductive material 612.

Figure 7:
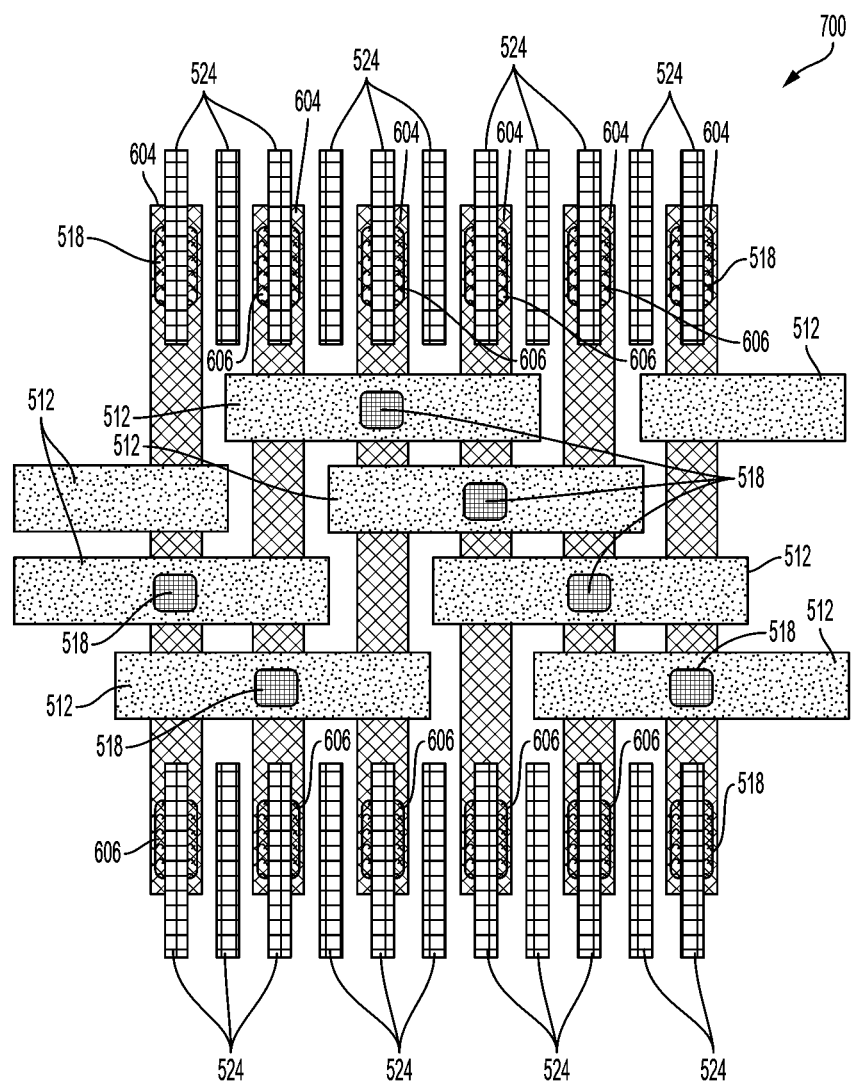
FIG. 7 is a plan view of a second portion of the memory device of FIG. 5, according to some embodiments.

FIG. 7 is a plan view of a second portion 700 of the memory device 500 of FIG. 5, according to some embodiments. The second portion 700 includes the word lines 524 and the memory cell wafer contact pad 518 of the memory cell wafer 504 (FIG. 5, not shown in FIG. 7) and the CMOS wafer contact pads 512 of the CMOS wafer 502 (FIG. 5, not shown in FIG. 7).

FIG. 7 illustrates electrical connection between the word lines 524 and the CMOS wafer contact pads 512. The second portion 700 includes memory cell wafer interconnects 606 and memory cell wafer conductive material 604 of the memory cell wafer 504 electrically connecting the word line 524 to the memory cell wafer contact pads 518. The word lines 524 are electrically connected to the CMOS wafer contact pads 512 through the memory cell wafer interconnects 606, the memory cell wafer conductive material 604, and the memory cell wafer contact pads 518.

Figure 8:
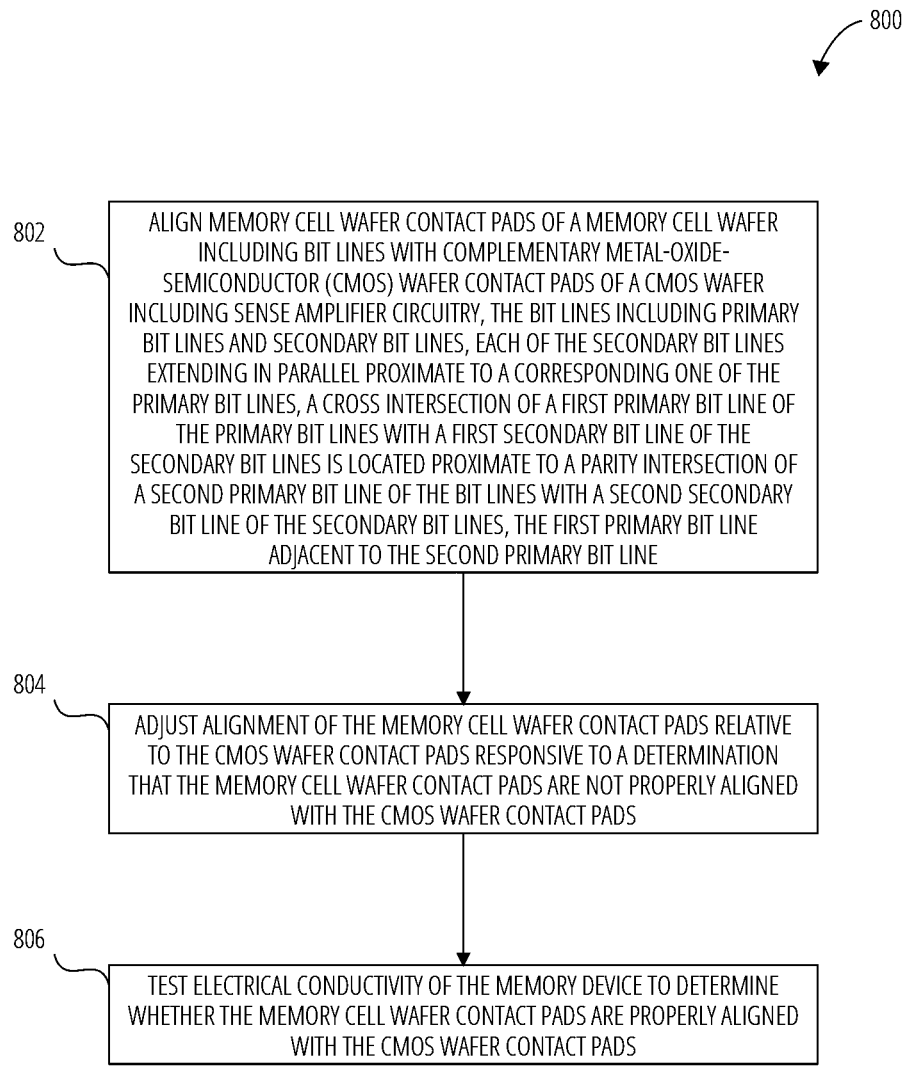
FIG. 8 is a flowchart illustrating a method of manufacturing a memory device (e.g., the memory device of FIG. 1A, the memory device of FIG. 5, without limitation), according to some embodiments.

FIG. 8 is a flowchart illustrating a method 800 of manufacturing a memory device (e.g., the memory device 100 of FIG. 1A, the memory device 500 of FIG. 5, without limitation), according to some embodiments. At operation 802 the method 800 includes aligning memory cell wafer contact pads (e.g., the memory cell wafer contact pads 118 of FIG. 1A, FIG. 1D, FIG. 1E, FIG. 2, and FIG. 3, the memory cell wafer contact pads 518 of FIG. 5, FIG. 6, and FIG. 7) of a memory cell wafer (e.g., the memory cell wafer 104 of FIG. 1A, FIG. 1D, and FIG. 1E, the memory cell wafer 504 of FIG. 5) including bit lines with CMOS wafer contact pads (e.g., the CMOS wafer contact pads 112 of FIG. 1A, FIG. 1D, FIG. 1E, FIG. 2, and FIG. 3, the CMOS wafer contact pads 512 of FIG. 5, FIG. 6, and FIG. 7) of a CMOS wafer (e.g., the CMOS wafer 102 of FIG. 1A, FIG. 1D, and FIG. 1E, the CMOS wafer 502 of FIG. 5) including sense amplifier circuitry (e.g., the sense amplifier circuitry 114 of FIG. 1A, FIG. 1B, and FIG. 1C, the sense amplifier circuitry 514 of FIG. 5). The bit lines include primary bit lines (e.g., the primary bit lines 120 of FIG. 1A, FIG. 1C, and FIG. 2, the primary bit lines 520 of FIG. 5 and FIG. 6) and secondary bit lines (e.g., the secondary bit lines 128 of FIG. 1A, FIG. 1B, FIG. 1C, FIG. 1D, FIG. 1E, and FIG. 2, the secondary bit lines 528 of FIG. 5 and FIG. 6). Each of the secondary bit lines extends in parallel proximate to a corresponding one of the primary bit lines. A cross intersection (e.g., the cross intersections 130 of FIG. 1C, the cross intersections 608 of FIG. 6) of a first primary bit line of the primary bit lines with a first secondary bit line of the secondary bit lines is located proximate to a parity intersection (e.g., parity intersection 132 of FIG. 1C, parity intersection 610 of FIG. 6) of a second primary bit line of the bit lines with a second secondary bit line of the secondary bit lines. The first primary bit line is adjacent to the second primary bit line. In some embodiments aligning the memory cell wafer contact pads with the CMOS wafer contact pads includes positioning the memory cell wafer over the CMOS wafer (e.g., as shown in FIG. 1A through FIG. 3). In some embodiments aligning the memory cell wafer contact pads with the CMOS wafer contact pads includes positioning the CMOS wafer over the memory cell wafer (e.g., as shown in FIG. 5 through FIG. 7).

At operation 804 the method 800 includes adjusting alignment of the memory cell wafer contact pads relative to the CMOS wafer contact pads responsive to a determination that the memory cell wafer contact pads are not properly aligned with the CMOS wafer contact pads. In some embodiments adjusting alignment of the memory cell wafer contact pads relative to the CMOS wafer contact pads may include measuring a deviation of a bonding alignment with an optical measuring instrument and calculating an adjustment to be made to the alignment.

At operation 806 the method 800 includes testing electrical conductivity of the memory device to determine whether the memory cell wafer contact pads are properly aligned with the CMOS wafer contact pads. In some embodiments testing the electrical conductivity of the memory device includes performing a TEG test using probe pads (e.g., the probe pads 402 and/or the probe pads 412 of FIG. 4A and FIG. 4B) of the memory cell wafer. In some embodiments the testing may be performed after the contact pads have been formed, and the contact pad position may not be adjusted after the testing of the electrical conductivity.

Figure 9:
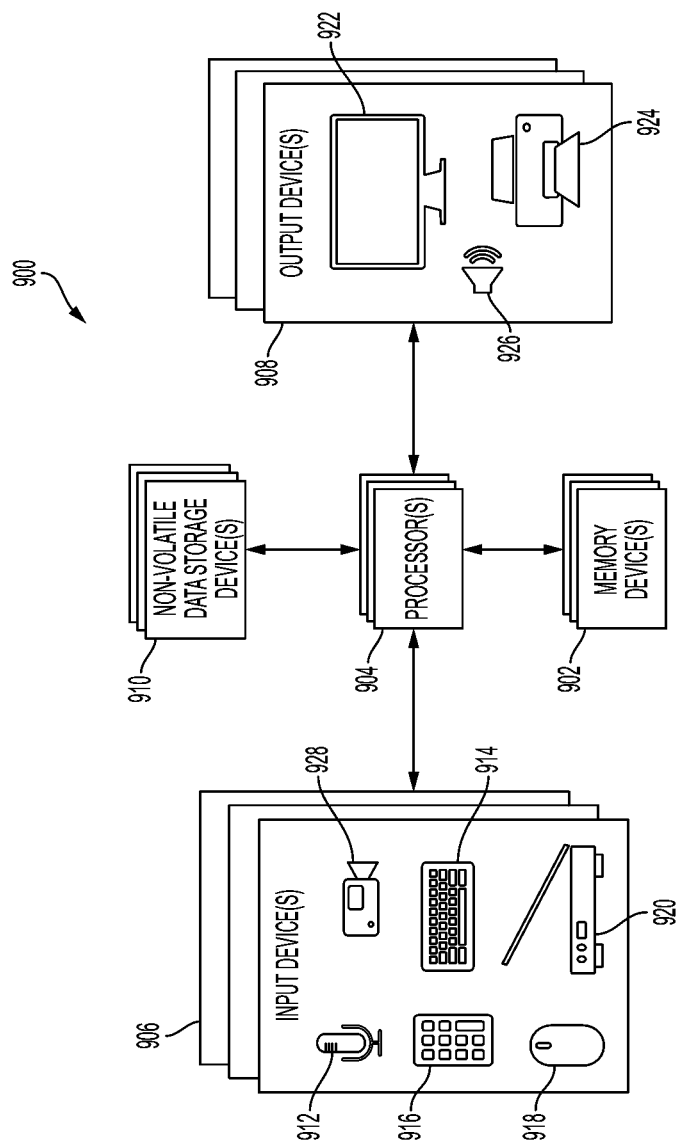
FIG. 9 is a block diagram of a computing system, according to some embodiments.

FIG. 9 is a block diagram of a computing system 900, according to some embodiments. The computing system 900 includes one or more processors 904 operably coupled to one or more memory devices 902, one or more non-volatile data storage devices 910, one or more input devices 906, and one or more output devices 908. In some embodiments the computing system 900 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 904 may include a central processing unit (CPU) or other processor configured to control the computing system 900. In some embodiments the one or more memory devices 902 include random access memory (RAM), such as volatile data storage (e.g., dynamic RAM (DRAM) static RAM (SRAM), etc.). In some embodiments the one or more non-volatile data storage devices 910 include a hard drive, a solid state drive, Flash memory, erasable programmable read only memory (EPROM), other non-volatile data storage devices, or any combination thereof. In some embodiments the one or more input devices 906 include a keyboard 914, a pointing device 918 (e.g., a mouse, a track pad, etc.), a microphone 912, a keypad 916, a scanner 920, a camera 928, other input devices, or any combination thereof. In some embodiments the output devices 908 include an electronic display 922, a speaker 926, a printer 924, other output devices, or any combination thereof.

The memory devices 902 include a CMOS wafer and a memory cell wafer bonded to the CMOS wafer according to embodiments disclosed herein. The CMOS wafer includes sense amplifier circuitry and sub word driver circuitry. The memory cell wafer includes primary bit lines and secondary bit lines. Each of the secondary bit lines extends in parallel proximate to a corresponding one of the primary bit lines. A cross intersection of a first primary bit line of the primary bit lines with a first secondary bit line of the secondary bit lines is located proximate to a parity intersection of a second primary bit line of the bit lines with a second secondary bit line of the secondary bit lines. The first primary bit line is adjacent to the second primary bit line. The memory cell wafer further includes word lines electrically connected to the sub word driver circuitry.

The memory cell wafer includes memory cell wafer contact pads and the CMOS wafer includes CMOS wafer contact pads bonded to the memory cell wafer contact pads. The memory cell wafer includes probe pads electrically connected to a TEG. The probe pads are configured to enable testing to determine whether the CMOS wafer contact pads are properly aligned with the memory cell wafer contact pads.

In some embodiments the memory cell wafer is positioned over the CMOS wafer. In some embodiments the CMOS wafer is positioned over the memory cell wafer.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the disclosure has been described herein with respect to certain illustrated embodiments, those of ordinary skill in the art will recognize and appreciate that the disclosure is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a complementary metal-oxide-semiconductor (CMOS) wafer including:
      CMOS wafer contact pads; and
      sense amplifier circuitry electrically connected to some of the CMOS wafer contact pads; and
   a memory cell wafer attached to the CMOS wafer, the memory cell wafer including:
      memory cell wafer contact pads; and
      bit lines electrically connected to some of the memory cell wafer contact pads, the bit lines including primary bit lines and secondary bit lines, each of the secondary bit lines extending in parallel proximate to a corresponding one of the primary bit lines, a cross intersection of a first primary bit line of the primary bit lines with a first secondary bit line of the secondary bit lines located proximate to a parity intersection of a second primary bit line of the primary bit lines with a second secondary bit line of the secondary bit lines, the first primary bit line adjacent to the second primary bit line.

2. The apparatus of claim 1, wherein the CMOS wafer contact pads are elongated to accommodate misalignment between the CMOS wafer contact pads and the memory cell wafer contact pads.

3. The apparatus of claim 1, wherein the memory cell wafer contact pads are bonded to the CMOS wafer contact pads with the memory cell wafer over the CMOS wafer.

4. The apparatus of claim 1, wherein the memory cell wafer contact pads are bonded to the CMOS wafer contact pads with the CMOS wafer over the memory cell wafer.

5. The apparatus of claim 1, wherein the memory cell wafer further comprises probe pads electrically connected to a test element group (TEG), the probe pads configured to enable testing to determine whether the CMOS wafer contact pads are properly aligned with the memory cell wafer contact pads.

6. The apparatus of claim 1, wherein:
the CMOS wafer includes sub word driver circuitry electrically connected to others of the CMOS wafer contact pads; and
the memory cell wafer includes word lines electrically connected to others of the memory cell wafer contact pads.

7. The apparatus of claim 6, wherein the word lines include at least two extra word lines.

8. The apparatus of claim 1, wherein the CMOS wafer further includes a compensation capacitor in a vacant area of the CMOS wafer.

9. The apparatus of claim 1, wherein the memory cell wafer includes memory cells electrically connected to the bit lines.

10. The apparatus of claim 9, wherein the memory cells are 4F2 memory cells.

11. A method of manufacturing a memory device, the method comprising:
aligning memory cell wafer contact pads of a memory cell wafer including bit lines with complementary metal-oxide-semiconductor (CMOS) wafer contact pads of a CMOS wafer including sense amplifier circuitry, the bit lines including primary bit lines and secondary bit lines, each of the secondary bit lines extending in parallel proximate to a corresponding one of the primary bit lines, a cross intersection of a first primary bit line of the primary bit lines with a first secondary bit line of the secondary bit lines located proximate to a parity intersection of a second primary bit line of the primary bit lines with a second secondary bit line of the secondary bit lines, the first primary bit line adjacent to the second primary bit line;
adjusting alignment of the memory cell wafer contact pads relative to the CMOS wafer contact pads responsive to a determination that the memory cell wafer contact pads are not properly aligned with the CMOS wafer contact pads; and
testing electrical conductivity of the memory device to determine whether the memory cell wafer contact pads are properly aligned with the CMOS wafer contact pads.

12. The method of claim 11, wherein aligning the memory cell wafer contact pads with the CMOS wafer contact pads comprises positioning the memory cell wafer over the CMOS wafer.

13. The method of claim 11, wherein aligning the memory cell wafer contact pads with the CMOS wafer contact pads comprises positioning the CMOS wafer over the memory cell wafer.

14. The method of claim 11, wherein testing the electrical conductivity of the memory device comprises performing a test element group (TEG) test using probe pads of the memory cell wafer.

15. A computing system, comprising:
a memory device including:
a complementary metal-Oxide-semiconductor (CMOS) wafer including sense amplifier circuitry and sub word driver circuitry; and
a memory cell wafer bonded to the CMOS wafer, the memory cell wafer including primary bit lines and secondary bit lines, each of the secondary bit lines extending in parallel proximate to a corresponding one of the primary bit lines, a cross intersection of a first primary bit line of the primary bit lines with a first secondary bit line of the secondary bit lines located proximate to a parity intersection of a second primary bit line of the primary bit lines with a second secondary bit line of the secondary bit lines, the first primary bit line adjacent to the second primary bit line.

16. The computing system of claim 15, wherein the memory cell wafer further includes word lines electrically connected to the sub word driver circuitry.

17. The computing system of claim 15, wherein the memory cell wafer includes memory cell wafer contact pads and the CMOS wafer includes CMOS wafer contact pads bonded to the memory cell wafer contact pads.

18. The computing system of claim 17, wherein the memory cell wafer includes probe pads electrically connected to a test element group (TEG), the probe pads configured to enable testing to determine whether the CMOS wafer contact pads are properly aligned with the memory cell wafer contact pads.

19. The computing system of claim 15, wherein the memory cell wafer is positioned over the CMOS wafer.

20. The computing system of claim 15, further comprising:
one or more processors electrically connected to the memory device;
one or more non-volatile data storage devices electrically connected to the one or more processors;
one or more input devices electrically connected to the one or more processors; and
one or more output devices electrically connected to the one or more processors.

* * * * *